US005637883A

United States Patent [19]
Bowman et al.

[11] Patent Number: 5,637,883
[45] Date of Patent: Jun. 10, 1997

[54] OPTICALLY ADDRESSED SPATIAL LIGHT MODULATOR USING AN INTRINSIC SEMICONDUCTOR ACTIVE MATERIAL AND HIGH RESISTIVITY CLADDING LAYERS

[75] Inventors: Steven R. Bowman, Davidsonville; William S. Rabinovich, Silver Spring, both of Md.; Douglas S. Katzer, Alexandria; Harry B. Dietrich, Fairfax, both of Va.

[73] Assignee: The United States of America as represented by the Secretary of the Navy, Washington, D.C.

[21] Appl. No.: 399,102

[22] Filed: Feb. 27, 1995

[51] Int. Cl.⁶ ........................ H01L 29/06; H01L 31/0328
[52] U.S. Cl. ........................ 257/21; 257/25; 257/184; 257/656; 359/245; 359/248
[58] Field of Search ........................ 257/14, 15, 21, 257/24, 25, 184, 656; 359/245, 246, 247, 248, 256

[56] References Cited

U.S. PATENT DOCUMENTS

| | | |
|---|---|---|
| 5,004,325 | 4/1991 | Glass et al. . |
| 5,031,012 | 7/1991 | Cunningham et al. . |
| 5,115,335 | 5/1992 | Soreg ........................ 359/248 |
| 5,488,504 | 1/1996 | Worchesky et al. ........................ 359/248 |

OTHER PUBLICATIONS

Bowman et al., *Appl. Phys. Lett.*, 65(8), 22 Aug. 1994, 956–958, "High–Resolution . . . Quantum Wells".
Partovi et al., *Appl. Phys. Lett.* 62(5), 1 Feb. 1993, 464–466, "Cr–Doped GaAs/AlGoAs . . . Devices".

Yablonvitch et al., *Appl. Phys. Lett.*, 51(26), 28 Dec. 1987, 2222–2224, "Extreme . . . GaAs Films".

Rabinovich et al., *Appl. Phys. Lett.*, 27 Feb. 1995, "Intrinsic multiple quantum well spatial light modulator".

Kyono et al., *Appl. Phys. Lett.*, 64(17), 25 Apr. 1994, 2244–2246, "GaAs/AlGaAs . . . Epitaxial Light–Off".

Partovi et al., *Appl. Phys. Lett.* 59(15), 7 Oct. 1991, 1832–1834, "High Sensitivity . . . Well Structures".

Glass et al., *Optics Letters*, vol. 15, No. 5, Mar. 1, 1990, 264–266, "Resonant . . . Quantum Wells".

Nolte et al., *J. Opt. Soc. Am. B.*, Nov. 1990, 2217–2225, "Resonant Photodiffractive . . . Wells".

*Primary Examiner*—Minh-Loan Tran
*Attorney, Agent, or Firm*—Thomas E. McDonnell; Barry A. Edelberg

[57] ABSTRACT

An optically addressed spatial light modulator includes top and bottom conductive layers sandwiching an intrinsic semiconductor multilayer structure. A cladding layer having a high trapping density is sandwiched between at least one of the electrodes and the intrinsic semiconductor layer structure. Typically, one cladding layer will be sandwiched between the top conductive layer and the intrinsic semiconductor multilayer structure and another cladding layer will be sandwiched between the bottom conductive layer and the intrinsic semiconductor structure. The cladding layer or layers laterally confine the photocarriers generated within the intrinsic semiconductor multilayer structure.

20 Claims, 4 Drawing Sheets

OPTICALLY ADDRESSED SPATIAL LIGHT MODULATOR USING AN INTRINSIC SEMICONDUCTOR ACTIVE MATERIAL AND HIGH RESISTIVITY CLADDING LAYERS

BACKGROUND OF THE INVENTION

1. Field of the Invention

The present invention relates generally to optically addressed spatial light modulators and more particularly to perpendicular field optically addressed spatial light modulators.

2. Description of the Background Art

Recent demonstrations of perpendicular geometry GaAs/AlGaAs multiple quantum well (MQW) structures as optically addressed spatial light modulators (OASLM) have shown that these devices can offer high speed and high resolution.

These prior art devices use multiple quantum wells that have been made semi-insulating by ion implantation or chromium doping. An AC electric field is applied perpendicular to the plane of the wells at a rate faster than the dark screening time of the material. The surface of the quantum well is then exposed to a write beam that creates photocarriers which screen the applied field in the illuminated regions. The result is an internal electric field which is modulated in the same pattern as the write beam. The optical properties of the quantum well are then changed through the quantum confined Stark effect, and read out with a beam that is nearly resonant with the heavy hole exciton.

All MQW OASLMs to date have had deep traps distributed throughout the MQW region. These "bulk" traps have been thought necessary to decrease the dark conductivity of the MQW layers so that screening is largely due to photogenerated, and not background carriers. In addition, the bulk traps were included to restrict the lateral diffusion of photocarriers which degrades OASLM resolution. The use of these bulk traps, which were essential to the good operation of parallel field geometry MQW OASLMs, has been adopted by the prior art in the manufacture of perpendicular field MQW OASLMs.

Bowman et al., *Appl Phys. Lett* 65 (8), 22 Aug. 1994, pp 956–958 (the entirety of which is incorporated herein by reference, for all purposes), describe a perpendicular field MQW OASLM in which a proton-implanted semiconductor layer was sandwiched between two transparent electrodes. The bottom transparent electrode rested upon a glass substrate. The proton implanted semiconductor layer was photodiffracting and constructed from 75 periods of 10 nm GaAs quantum wells separated by 3.5 nm of $Al_xGa_{1-x}As$ barriers. Proton beam energy and fluence were controlled to generate a uniform defect density of $4\times10^{16}$ cm$^{-3}$ in the implanted semiconductor layer. After proton implantation, the dark resistivity of the semiconductor layer was approximately $2\times10^9 \Omega$ cm. Samples with 10 mole percent aluminum in the barrier layers and samples with 30 mole percent aluminum in the barrier layer were made. The top electrode was insulated from the proton implanted semiconductor material by a dielectric layer. Additionally, the top and bottom surfaces of the semiconductor layer were clad with 30 nm of AlGaAs grown at a wafer temperature of 330° C. and annealed at 580° C. The material, described as "low temperature" AlGaAs, has been shown to have a dark resistivity of $10^{12} \Omega$ cm for applied fields of less than $10^5$ V/cm. This perpendicular field MQW OASLM, while having good resolution, suffered from less than optimal speed and sensitivity. The less than desirable speed and sensitivity of previous perpendicular field MQW OASLMs reduces the efficiency of these devices and also limits their use. Additionally, the need for implantation increases the costs and complexity of manufacture.

SUMMARY OF THE INVENTION

Accordingly, it is an object of this invention to enhance the speed and sensitivity of perpendicular field MQW OASLMs.

It is another object of the present invention to improve the efficiency of perpendicular field MQW OASLMs.

It is a further object of the present invention to reduce the costs and complexity of manufacturing a MQW OASLM.

These and other objects are accomplished by cladding an active, photodiffracting layer of intrinsic semiconductor material with one or more cladding layers of material having a high trapping density. Typically the photodiffracting intrinsic semiconductor multilayer structure is composed of layers of quantum wells alternating with barrier layers. Both the quantum well layers and the barrier layers are intrinsic semiconductors. The cladding layer/photodiffracting intrinsic multilayer structure/cladding layer section is sandwiched between a top conductive layer and a bottom conductive layer. The bottom conductive layer rests on a substrate. Typically, the substrate is non-conductive or semi-insulating, but it may also be conductive.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

The photodiffractive component of the present invention includes quantum well and is typically a multilayer heterostructure including alternating layers of quantum well and barrier layers. Useful multilayer heterostructures of this type have been described, for example, in the aforementioned Bowman et al., Appl. Phys. Lett 65 (8), 22 Aug. 1994, Pavorti et al., Appl. Phys. Lett. 62(5), 1 Feb. 1993 pp 464–466 (the entirety of which is incorporated herein by reference for all purposes), U.S. Pat. No. 5,004,325 to Glass et al. (the entirety of which is incorporated herein by reference for all purposes), and G. H. Dohler, Physica Scripta, Vol. 24 (1981) pp 430–439 (the entirety of which is incorporated herein by reference for all purposes). However, the prior art implants or otherwise dopes these structures to render the semiconductors from which they are made semi-insulating. In contrast to the prior art, the multilayer heterostructures used in the present invention are intrinsic semiconductors.

A photodiffractive multilayer heterostructure useful in the present invention may be any series of intrinsic semiconducting layers in which a layer having a plurality of quantum wells alternates with a barrier layer. It is particularly advantageous to employ a multilayer heterostructure with a sufficiently high bandgap to prevent or minimize the thermal generation of charge carriers. Perhaps the most typical multilayer heterostructure is GaAs/AlGaAs. In that multilayer heterostructure, GaAs well layers alternate with AlGaAs barrier layers. The performance of this multilayer heterostructure can be modified by varying the amount of aluminum in the AlGaAs barrier layers, thus changing the barrier height. Examples of other well-known multilayer heterostructures useful in the present invention include, but are not limited to, InGaAs/GaAs and GaSb/AlGaSb. The multilayer structure should be grown by a technique that minimizes unintentional doping, such as molecular beam epitaxy (MBE). Increasing levels of unintentional doping decrease the efficiency of the optically addressed spatial light modulator.

Spatial resolution requires that the lateral movement of photocarriers generated within the optically addressed spatial light modulator be restricted. In the present invention, at least one cladding layer having a high trapping density is sandwiched between the multilayer heterostructure and an adjacent conductive layer. Generally, the trapping density required within the cladding layer depends upon the field applied within the multilayer heterostructure, the presence or absence of a dielectric layer between the cladding layer and its adjacent conducting layer, and the resolution desired. At the voltage to be applied, the cladding layer, as used in the optically addressed spatial light modulator, should have a sufficiently high concentration of traps to trap the photocarriers and thus restrict their lateral movement and avoid saturation of the traps during use. To avoid saturation, the cladding layer should have a sufficiently number of traps to trap essentially all photocarriers generated within the multilayer heterostructure. For example, at typically applied fields of about 10 to about 100 kV/cm, the cladding layer typically has a defect density of about $10^{15}$ cm$^{-3}$ to about $10^{20}$ cm$^{-3}$. The presence of defects or traps within the cladding layer usually, but not always, increases the dark resistivity of the cladding layer. Typically, a cladding layer having a trap density sufficient for use in the present invention will also have a dark resistivity of about $10^9$ Ω-cm to about $10^{13}$ Ω-cm or more. Most often, such cladding layers will have a dark resistivity of about $10^{11}$ Ω-cm to about $10^{12}$ Ω-cm or more. If desired, the minimum trapping density needed may be determined empirically, and/or by using well-known physical principles and equations. If the cladding layer has too low of a resistivity or trapping density, spatial resolution suffers. The use of a dielectric layer between the cladding layer and the adjacent conductive layer can somewhat reduce either the required trap density or minimum thickness needed in the cladding layer. However, while the use of a dielectric layer can prevent the dielectric breakdown or saturation which might otherwise occur in the case of an overly thin cladding layer, the use a dielectric layer will not correct for a cladding layer that is too thin to provide the lateral confinement of photocarriers needed for the desired resolution.

The cladding layer may be any material having the required and trapping density. Suitable materials include, but are not limited to low temperature grown GaAs, low temperature grown AlGaAs, and hydrogenated alpha silicon. The most typical cladding layer is described in the art as low temperature AlGaAs or low temperature GaAs. Typically, low AlGaAs or GaAs with the needed trapping density has been grown at about 200° C. to about 600° C. and annealed at about 550° C. to about 850° C. Most often, low temperature AlGaAs is grown on a substrate at a temperature of about 300° C. or less and annealed at a temperature of about 580° C.

To provide an electric field across and perpendicular to the multilayer heterostructure, the cladding layers are sandwiched between conductive layers upon which a suitable voltage has been imposed. So that light may travel the multilayer heterostructure, at least one of the conductive layer must be at least partially transparent to the light to be modulated. Otherwise, the composition of the conductive layers is not critical, provided that the materials of the conductive layers are compatible with the adjoining layers and the method of fabrication selected. Typical transparent conductive layers include, but are not limited to, Cu:Au of sufficient thinness for transparency (typically having a thickness of about 100 Å), indium tin oxide, n- or p-doped AlGaAs and n-doped or p-doped GaAs. Typical conductive layers that may be used where transparency is not required include, but are not limited to, Cr:Au or other metals with thicknesses far in excess of 100 Å.

The bottom end of the device according to the present invention should be attached to a substrate by any suitable method, for example solid phase bonding, epoxy bonding or by growth of the bottom of the device thereon. If light is to pass through each end of the device, then the substrate should be transparent to the light intended to pass therethrough. Alternatively, a reflector layer may be included between the bottom cladding layer and the substrate. The reflector layer may serve as the conductive layer, or a conductive layer may be included between the substrate and the reflector layer. If a reflector layer is positioned between the cladding layer and the substrate, the substrate need not be transparent or essentially transparent. Typical transparent substrates include, but are not limited to, quartz, glass, InP, and AlGaAs. Typical non-transparent or opaque substrates include, but are not limited to, GaAs and GaSb.

Depending upon the exact configuration and materials used, it may be necessary to include a dielectric layer between at least one conductive layer and the nearest cladding layer. If at least one cladding layer has a sufficiently high number of traps to prevent electrical breakdown, the dielectric layer need not be used. Thus, the presence of a dielectric layer can compensate somewhat for the use of what might otherwise be overly thin cladding layers.

If used, the reflector layer may be a metallic layer of sufficient thickness to essentially completely reflect the light to be modulated or may be a Bragg reflector selected to provide near complete reflection of the light to be modulated. Any Bragg reflector layer materials may be used. One typical and useful Bragg reflector layer is made of alternating layers of AlGaAs/AlAs, each layer having a thickness of about one quarter of the wavelength to be reflected.

The appropriate thickness of each layer of the optically addressed spatial light modulator according to the present invention varies depending upon the materials used, the wavelength to be modulated, and the effect desired. These thicknesses can be determined by mathematical calculation and/or empirically. Typically, each cladding layer is about 30 nm to about 500 nm thick. If the cladding layer is too thin, the cladding layer will have an insufficient number of traps and saturation will occur. The presence of a dielectric layer adjacent the cladding layer reduces the thickness of the cladding layer needed. Without a dielectric layer adjacent the cladding layer, a cladding thickness of about 100 to about 500 nm is typically used. Most typically, in the absence of an adjacent dielectric layer, each cladding layer is about 300 nm to about 500 nm thick. If the cladding layers are too thick, a larger voltage will need to be applied across the device, and the speed, resolution and efficiency of the spatial light modulator will be reduced.

Generally, the thickness of the other layers of the spatial light modulator according to the present invention will be about the same as the thickness of an analogous layer in a prior art device. Often, the thickness of the multilayer heterostructure is about 0.5 μm to about 10 μm, although other thicknesses may be used depending upon the materials employed and the wavelength of the light to be modulated. Generally, but not necessarily, in the present invention, the thickness of the multilayer heterostructure is roughly equal to the sum of the thicknesses of the cladding layers. Additionally, the examples illustrate some useful thicknesses for each layer FIGS. 1 through 3, however, are not drawn to scale. No information regarding either the thickness or relative thickness of any layer should be taken from the depiction that layer in FIGS. 1 through 3.

Figure 1:
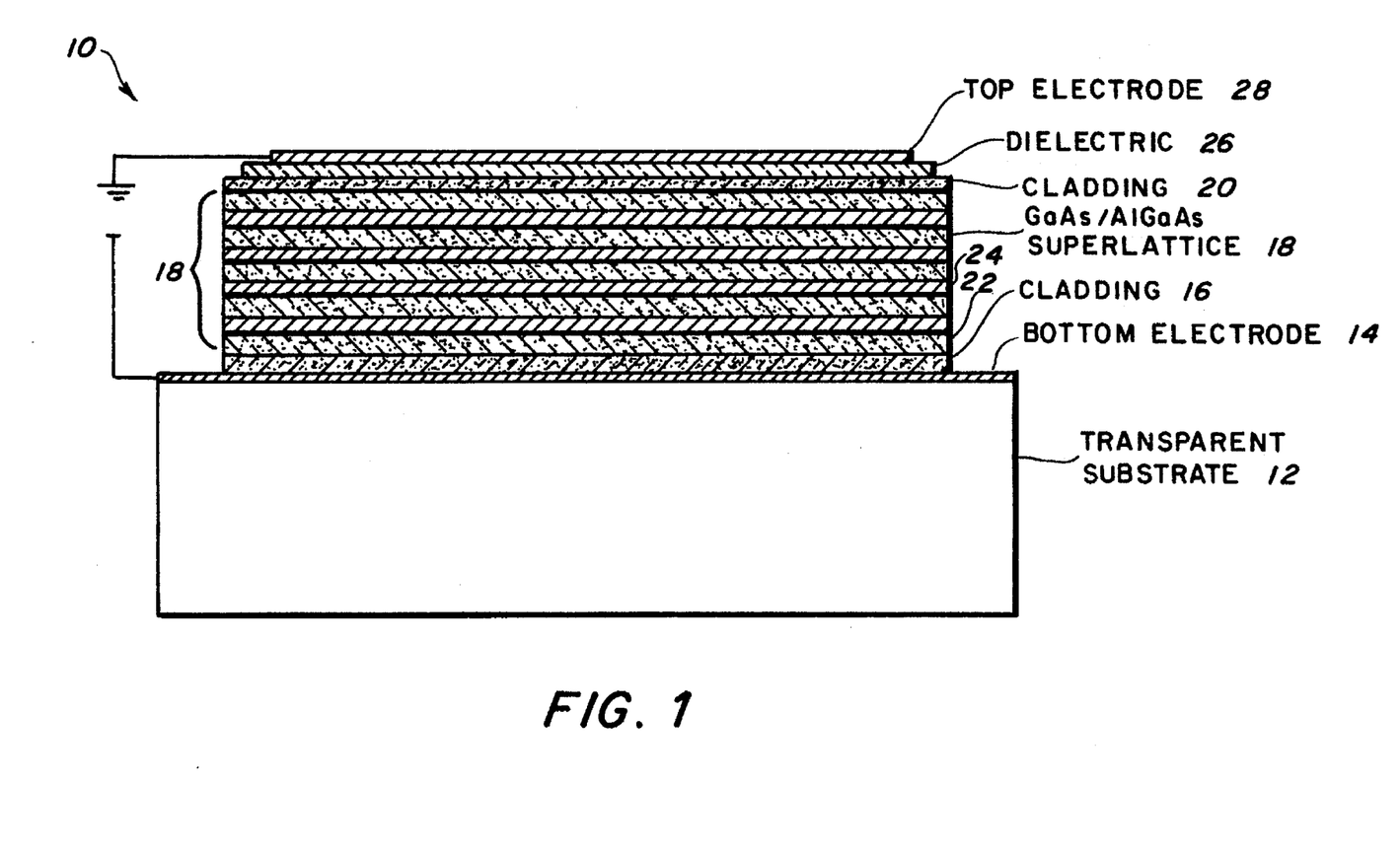
FIG. 1 is a schematic view of a first embodiment of an optically addressed spatial light modulator according to the present invention.

FIG. 1 show a preferred embodiment of an optically addressed spatial light modulator 10 according to the method of the present invention. Substrate 12, for example glass, is transparent to the light to be passed therethrough and has a transparent bottom conductive layer 14 attached thereto. The upper surface of bottom conductive layer 14 is attached to cladding layer 16. A multilayer heterostructure 18 of intrinsic semiconductor is sandwiched between cladding layer 16 and cladding layer 20. Multilayer heterostructure 18 may be, for example, a GaAs/AlGaAs superlattice in which GaAs quantum wells layers 22 alternate with AlGaAs barrier layers 24. Dielectric layer 26 is sandwiched between cladding 20 and a transparent top conductive layer 28.

In use, an alternating current voltage is imposed between and perpendicular to bottom conductive layer 14 and top conductive layer 28 thus creating an electrical field within multilayer heterostructure 18. The voltage imposed between bottom conductive layer 14 and top conductive layer 28 alternates at a rate faster than the dark screening time of multilayer heterostructure 18. This alternating electrical field causes the quantum-confined Stark effect. As a result of the quantum-confined Stark effect, the exciton peaks in the quantum wells of the multilayer heterostructure 18 shift and broaden. Thus, at wavelengths near the resonant exciton, the absorption and refractive index change. Exposure of multilayer heterostructures 18 to a write beam of light, typically but not necessarily at an acute angle with respect to a line perpendicular to multilayer heterostructure 18, at a wavelength shorter than the band edge generates photocarriers in multilayer heterostructure 18. These photocarriers travel toward the oppositely charged conductive layer 12, 14. Before reaching oppositely charged conductive layer 12, 14, the photocarriers are trapped in the intervening cladding layer 16, 20, where they screen the applied field in the illuminated regions. As a result of this screening, the internal electrical field within multilayer heterostructure 18 is modulated in the same pattern as the write beam. This change in internal electrical field is detected by a read beam, transmitted through the multilayer heterostructure, that is nearly resonant with the heavy hole or light: hole exciton. When the poles of the field imposed between top conductive layer 28 and bottom conductive layer 14 are reversed, the process begins anew.

The high trapping density of cladding layers 16, 20 prevents lateral movement of trapped photocarriers. Photocarriers generated within multilayer heterostructure 18 traverse the bulk of multilayer heterostructure 18 quite quickly, and actually spend the majority of their time at or near the interfaces between the cladding layer 16, 20 and multilayer 18. Thus, the high trapping density of cladding layers 16, 20 traps the photocarriers before the influence of neighboring and other photocarriers trapped within cladding layers 16, 20 can cause the electron to drift laterally.

The presence of unintentional dopants in multilayer heterostructure 18 can hamper efficiency. When a perpendicular AC field is applied to multilayer heterostructure 18, unintentional dopants can generate charged carriers in the absence of illumination. These charge carriers then screen at least some of the applied field, thus requiring a larger field and reducing efficiently. However, where multilayer heterostructure 18 is produced in a manner that results in a minimum level of unintentional doping (The unintentional doping density should be such that the total number of carriers/cm$^2$ contained within the volume of the well is less than about $1$–$5 \times 10^{10}$/cm$^2$. Typically, the unintentional doping density is on the order of about $1 \times 10^{14}$/cm$^3$ to about $5 \times 10^{14}$/cm$^3$.) the amount of field unintentionally screened is no longer problematic. For example, MBE can provide materials having unintentional doping on the order of $10^{14}$ carriers/cm$^3$. This doping concentration is sufficient to screen only about 10% of the high fields applied to these materials in the perpendicular geometry (~50 kV/cm).

Thermally generated charge carriers can also screen charge and reduce efficiency. That problem can be avoided by selecting the materials for multilayer heterostructure 18 to provide a band gap sufficiently high to avoid or minimize the thermal generation of charge carriers.

If the multilayer heterostructure 18/cladding 16, 20 sandwich is to grown by MBE, growth must occur on a suitable substrate. To create the FIG. 1 embodiment, the sandwich is then lifted off the growth substrate and then bonded, typically by solid phase bonding, to transparent substrate 12 coated with transparent bottom conductive layer 14. The sandwich is then coated with dielectric 26 and top electrode 28.

Figure 2:
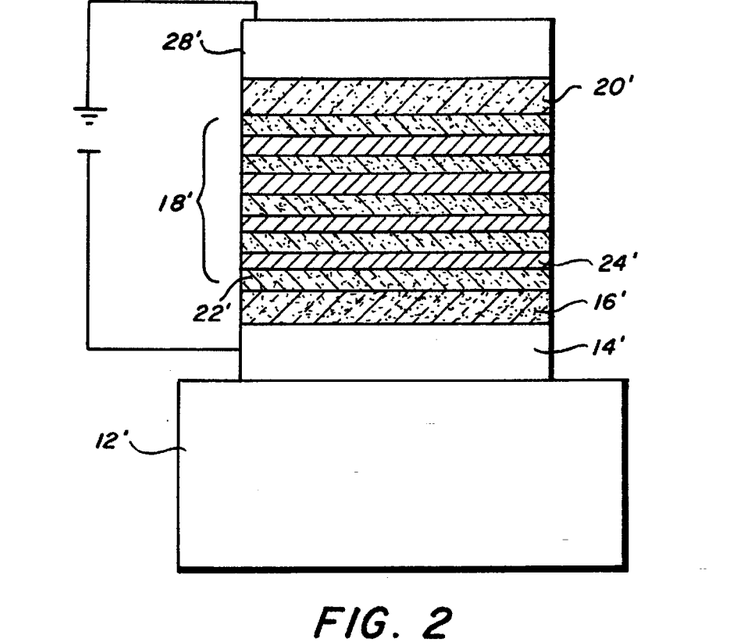
FIG. 2 is a schematic view of a second embodiment of an optically addressed spatial light modulator according to the present invention.

The embodiment shown in FIG. 2 avoids the necessity of using a lift off procedure, since the entire device can be fabricated by MBE. In FIG. 2, transparent substrate 12' is a material, such as InP, that can serve as a substrate for MBE. A transparent layer 14' of a semiconductor, such as n-doped AlGaAs, is grown by MBE on the upper surface of substrate 12'. Bottom cladding layer 16', multilayer heterostructure 18' of intrinsic semiconductor (having alternating layers of wells 22' and barriers 24') and top cladding layer 20' may be grown by MBE on transparent bottom semiconductor layer 14', similar to the manner in which layers 16, 18, and 20 of the FIG. 1 embodiment are grown upon a growth substrate. However, because the growth substrate in the FIG. 2 embodiment serves as an integral part of the final device, the lift-off step is eliminated. Finally, transparent top semiconductor layer 28' may be grown by MBE on the upper surface of cladding layer 20'. Semiconducting layer 28' may be formed from any of the materials useful in forming bottom semiconducting layer 14', and will typically have the same composition as semiconducting layer 14'.

In the FIG. 2 embodiment, top and bottom semiconducting layers 28' and 14' serve as top and bottom conductive layers upon which an AC voltage may be imposed so as to form an AC electrical field within multilayer heterostructure 18'. The use of cladding layers 16' and 20' of sufficient thickness to avoid the flow of current from multilayer heterostructure 18' to top semiconductor layer 28' obviates the need for a dielectric layer between a conductive layer and its adjacent cladding layer in the embodiment of FIG. 2. Elements 12', 16', 20', 22' and 24' function analogously to their corresponding elements 12, 16, 20, 22 and 24 in the FIG. 1 embodiment.

Figure 3:
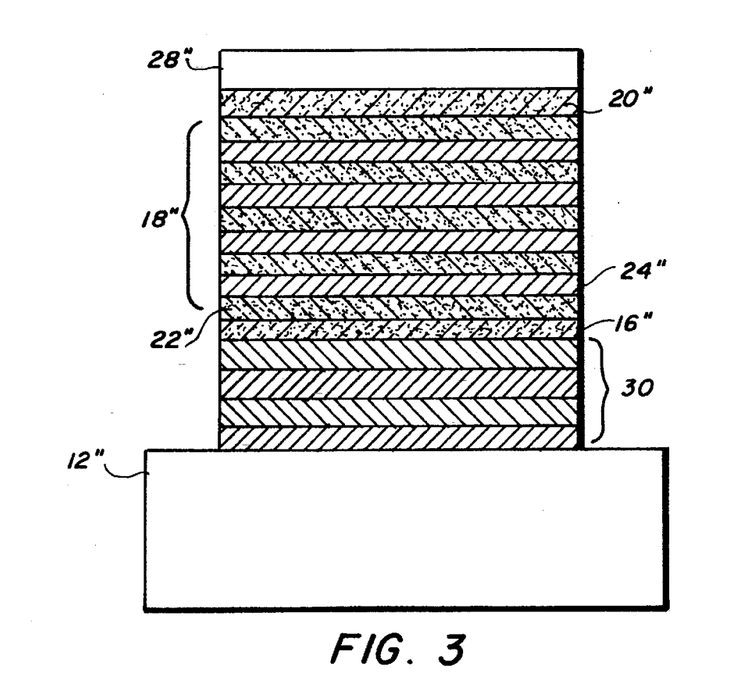
FIG. 3 is a schematic view of a third embodiment of an optically addressed spatial light modulator according to the present invention.

Transparent substrates compatible with MBE growth, such as InP, may be somewhat expensive and difficult to produce. FIG. 3 shows an embodiment of the present invention in which the substrate is not transparent. In FIG. 3, substrate 12" is a non-transparent material, such as GaAs. Bragg reflector 30, typically including about 10 to about 20 quarter-wave reflectors, 32, 34, 36 and 38 (for ease of drawing, only four quarter wave reflectors are shown in FIG. 3), may be grown by MBE on the upper surface of substrate 12". Typically, the Bragg reflector 30, or at least the portion of Bragg reflector 30 adjacent the upper surface of substrate 12", is conductive and serves as the conductive layer. Otherwise, a transparent or non-transparent conductive layer (not shown) may be grown on the upper surface of substrate 12" and the Bragg reflector grown on the conductive layer. High trapping density cladding layer 16" may then be grown by MBE on the upper surface of Bragg reflector 30 and is analogous in composition and function to cladding layer 16' in FIG. 2 and cladding layer 16 in FIG. 1. Multilayer heterostructure 18" may then be grown by MBE on the upper surface of cladding layer 16" and is analogous in composition and function to multilayer heterostructure 18' in FIG. 2 and multilayer heterostructure 18 in FIG. 1. High trapping density cladding layer 20" may then be grown by MBE on the upper surface of multilayer heterostructure 18" and is analogous in composition and function to cladding layer 20' in FIG. 2 and cladding layer 20 in FIG. 1. Transparent semiconducting layer 28" may then be grown by MBE on the upper surface of cladding layer 20" and is analogous in composition to transparent semiconducting layer 28' in FIG. 2.

In use, an AC voltage is applied between transparent semiconducting layer 28" and the bottom surface of Bragg reflector 30 or a conductive layer sandwiched between Bragg reflector 30 and substrate 12". The voltage imposed between the bottom conductive layer and the semiconducting layer 28" alternates at a rate faster than the dark screening time of multilayer heterostructure 18". This alternating electrical field causes the quantum-confined Stark effect. As a result of the quantum-confined Stark effect, the exciton peaks in the quantum wells of the multilayer heterostructure 18" shift and broaden. Thus, at wavelengths near the resonant exciton, the absorption and refractive index change. Exposure of the device to a write beam of light, perpendicular to the wells, at a wavelength near the band edge generates photocarriers in multilayer heterostructure 18". These photocarriers travel toward the oppositely charged of either the bottom conductive layer or semiconducting layer 28". Before reaching oppositely charged conductive layer, the photocarriers are trapped in the intervening cladding layer 16", 20", where they screen the applied field in the illuminated regions. As a result of this screening, the internal electrical field within multilayer heterostructure 18" is modulated in the same pattern as the write beam. This change in internal electrical field is detected by a read beam that is nearly resonant with the heavy hole exciton. In the FIG. 3 embodiment, the read beam enters the device through the top bottom surface of transparent semiconductor layer 28", passes through layer 20", 18" and 16". The read beam is then reflected by Bragg reflector 30. The reflected read beam passes through layers 16", 18", 20" and 28". When the poles of the field imposed between semiconducting layer 28" and the conductive layer at or adjacent Bragg reflector 30 are reversed, the process begins anew.

The spatial light modulator of the present invention can also have a reflector layer at one end and a semi-reflector (i.e., partially reflective, or half-mirror) layer at the opposite end. In this embodiment, light to be modulated would be transmitted through the semi-reflector top surface, through the multilayer heterostructure and cladding layers and to the reflector bottom surface adjacent to the substrate. The reflected light would then pass through the multilayer heterostructure and cladding layers to the top semi-reflector layer, and exit the device. In this way, the device may be operated as a symmetric or asymmetric Fabry-Perot etalon. Similarly, the device of the present invention may be constructed and operated such that the top and bottom conducting layers are both partially reflective.

While each of the above-described preferred embodiments have two cladding layers sandwiching the intrinsic semiconductor multilayer structure, only one cladding layer, sandwiched between the intrinsic semiconductor multilayer structure and either the top conductive layer or the bottom conductive layer, is needed. If only one cladding layer is used, the device will screen during one phase of the AC cycle.

Additionally, it should be noted that each "layer" element of the spatially addressed light modulator according to the present invention need not be an integral structure, but may instead be a series of layers that have been united to form a singular structure. For example, the dielectric layer, if used, may actually comprise a plurality of layers of the same or different dielectric materials joined together.

Having described the invention, the following examples are given to illustrate specific applications of the invention including the best mode now known to perform the invention. These specific examples are not intended to limit the scope of the invention described in this application.

EXAMPLES

Three OASLMs were fabricated from two wafers. The MQW region in both wafers was grown by MBE to the same specification: 75 periods of 10 nm GaAs wells separated by 3.5 nm of $Al_{0.3}Ga_{0.7}As$ barriers. Wafer 1 had, in addition, high resistivity cladding layers at both ends of the MQW region. These cladding layers consisted of 30 nm of low temperature (LT) grown $Al_{0.3}Ga_{0.7}As$. These LT layers were grown at a substrate temperature of 300° C. and annealed at 580° C. Low temperature AlGaAs grown under similar conditions to our own has shown dark resistivities of $10^{12}$ Ω-cm and trap densities higher than $10^{18}$ $cm^{-3}$. Wafer 2 had no LT cladding layers. Both wafers also had a thin sacrificial AlAs layer to be used for the lift-off process.

The wafers were fabricated into three devices. For each wafer, epitaxial lift-off was used to remove the 1 µm MQW from its growth substrate. The epitaxial lift off procedure used is described in E. Yablonovitch et al., *Appl. Phys. Lett.* 51, 2222 (1987), the entirety of which is incorporated herein by reference for all purposes. Each wafer was then attached, using solid phase bonding, to a quartz substrate coated with a transparent Cr/Pd/Au electrode. A 0.4 µm silicon nitride dielectric layer was then deposited on the top of the MQW followed by a Cr/Au transparent electrode. The details of the fabrication process are reported in Kyono et al., *Appl. Phys Lett.* 64, 2244 (1994), the entirety of which is incorporated herein by reference for all purposes.

Two devices were fabricated from wafer 1. The first device, designated SI/LT, was proton implanted to provide bulk traps and had low temperature AlGaAs layers to provide surface traps. A multiple step implantation process was used to generate a uniform defect density of approximately $4 \times 10^{16}$ $cm^{-3}$ throughout the 1 µm depth of the quantum well material. The second device, designated, INT/LT, was not proton implanted and thus had only surface traps due to the low temperature AlGaAs layers present in this wafer. The third device was fabricated from wafer 2. It was not proton implanted and had no low temperature AlGaAs layers. It was designated INT.

Figure 4A:
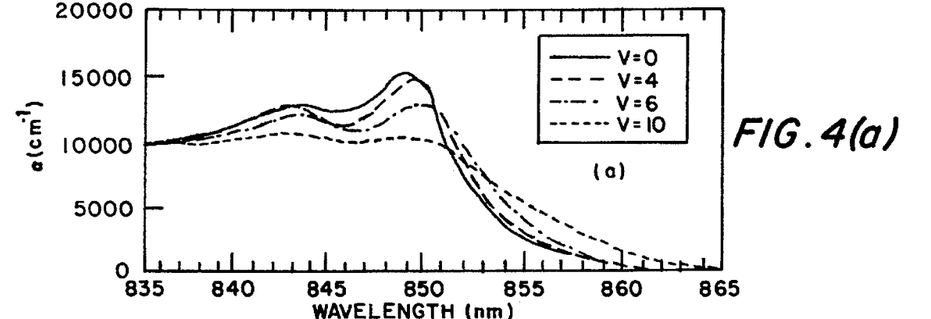
FIG. 4(a) through FIG. 4(c) are graphs showing the room temperature electroabsorption spectrum for (a) a prior art device with a proton implanted multilayer heterostructure and low temperature AlGaAs cladding layers; (b) a device according to the present invention having an intrinsic multilayer heterostructure and low temperature AlGaAs cladding layers; and (c) a device having an intrinsic multilayer heterostructure and no low temperature AlGaAs cladding layers.
Figure 4B:
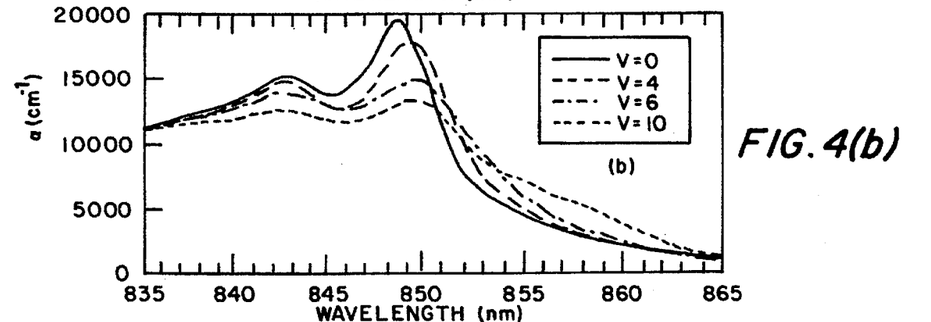
Figure 4C:
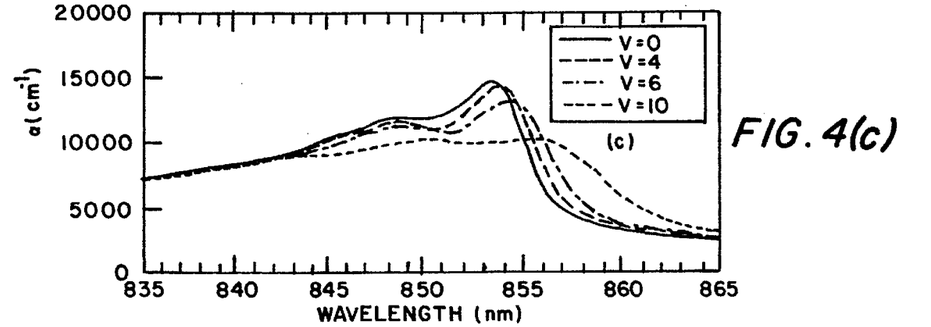

Electroabsorption was measured in all three devices at room temperature in a Fourier transform spectrometer at voltages that varied from 0 to 10 Volts. The spectra are shown in FIG. 4(a) through 4(c). The SI/LT sample has its heavy hole exciton peak at 849 nm and shows a peak electroabsorption of 5000 $cm^{-1}$ at this wavelength with 10 Volts applied. The INT/LT sample came from the same wafer and thus also shows a heavy hole and electroabsorption peak at 849, but has narrower exciton linewidths and a higher peak absorption modulation of 6000 $cm^{-1}$. This is because the proton implantation that the SI/LT device was subjected to broadens the exciton features and hence reduces the electroabsorption. This damage to the exciton is a disadvantage to ion implantation of the quantum wells. The INT sample came from a separate wafer and thus shows a slightly different absorption spectra. Its heavy hole peak is at 852 nm and its peak electroabsorption there is 4800 $cm^{-1}$.

Since all three devices show strong electroabsorption, their ability to store a space charge determines their diffraction efficiencies and resolution. The performance of the devices as spatial light modulators was evaluated using a tunable titanium sapphire laser and a self-diffraction experiment. A ±10 Volt square wave was applied to the MQW OASLM. To produce the grating interference pattern, an achromatic grating arrangement was used. The first order diffraction of one of the pump beams was measured using a silicon PIN photodiode.

Figure 5:
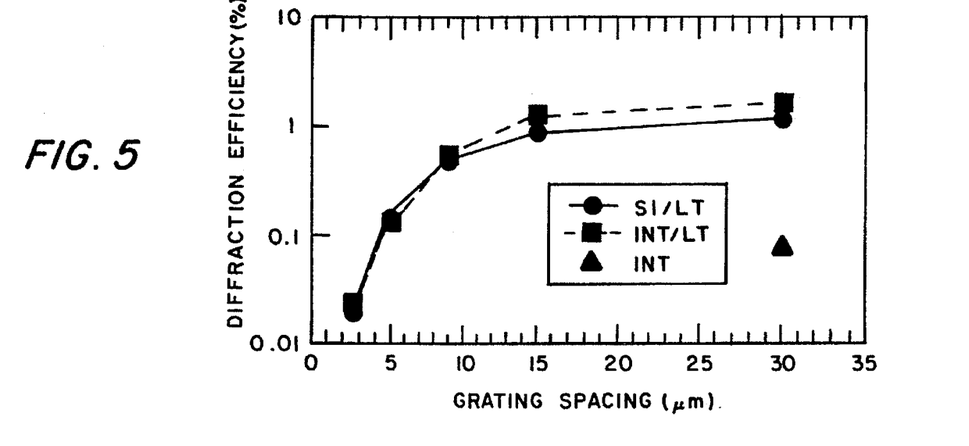
FIG. 5 is a graph showing the diffraction efficiency dependence on the spatial period of the grating for a prior art device with a proton implanted multilayer heterostructure and low temperature AlGaAs cladding layers (◆); a device according to the present invention having an intrinsic multilayer heterostructure and low temperature AlGaAs cladding layers (■); and a device having an intrinsic multilayer heterostructure and no low temperature AlGaAs cladding layers (▲).

The spatial resolution of the devices was determined by measuring the diffraction efficiency as a function of grating period. Diffraction efficiency is defined here as the ratio of the peak power in the diffracted order to that in the transmitted pump beam. For the SI/LT and INT/LT samples, diffraction was measured at 852.5 nm, near the peak of the diffraction. For the INT sample the diffraction was measured at 856 nm because the peak diffraction fell at this slightly longer wavelength. FIG. 5 shows diffraction efficiency for all three samples. At the longest grating period, the diffraction efficiency of the INT/LT device is approximately 50% larger than the SI/LT device. This is due to the larger electroabsorption this sample exhibits because it has not been proton implanted. As demonstrated in Bowman et al., *Appl Phys Lett.* 65, pp 956–958, the SI/LT maintains relatively high diffraction efficiency down to periods as short as 5 µm. However, as FIG. 5 shows, the INT/LT device's diffraction efficiency falls off only slightly faster with smaller grating period even though it contains no intentional traps in the MQW region. The INT sample which has no intentional traps in either the bulk or at the surface shows only a very weak diffraction at the longest grating period, and no measurable diffraction below 30 µm. This constitutes strong evidence that the resolution of MQW OASLMs operated in the perpendicular geometry is determined predominantly by traps at the interface between the MQW region and the dielectric and that the traps in the bulk MQW play little part. The weak diffraction from the INT sample may be due to unintentional trap sites or surface traps.

Next, the temporal performance of the devices was evaluated. In perpendicular mode MQW OASLMs, each voltage flip of the applied AC field constitutes a new cycle for the device. The speed at which the device can be run is determined by the time for the diffraction to reach its peak value. After a voltage flip, the diffraction efficiency begins to build up, reaching a peak at approximately the time when the illuminated regions of the sample have completely screened the applied voltage. This time is determined not by the transit time of carriers across the well, which is extremely short, but rather by the photogeneration rate of carriers into the conduction band. The time to peak is thus directly proportional to the illumination level. However, several photons must be absorbed to produce one carriers worth of screening. Presumably most of the carriers produced by these photons recombine or are trapped in defects within the MQW region before they can travel to the interface and produce the maximum amount of screening.

After peaking, diffraction begins to decline as screening occurs in the darker regions. Eventually a uniform space charge is accumulated at the interface, contrast in electroabsorption is lost and the diffraction signal drops to zero. The result is a transient diffraction pulse. The rise and fall times of this diffraction pulse are proportional to each other.

Figure 6:
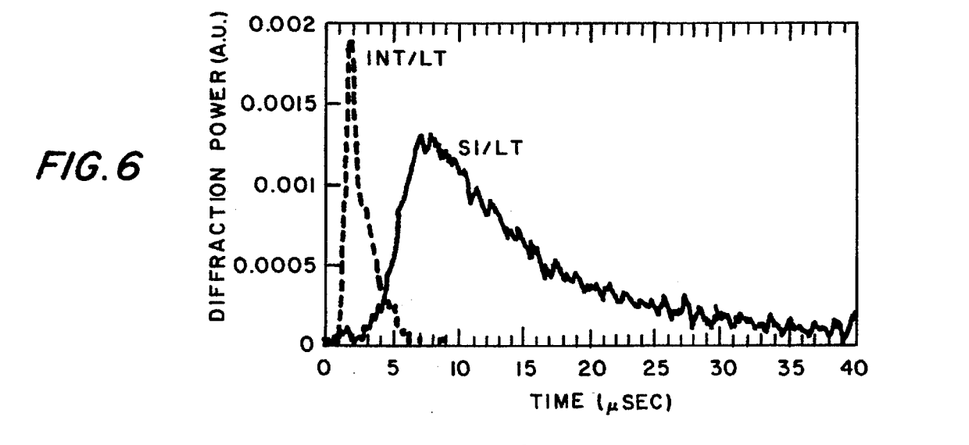
FIG. 6 is a graph showing the diffraction pulses for a prior art device with a proton implanted multilayer heterostructure and low temperature AlGaAs cladding layers (solid line); and a device according to the present invention having an intrinsic multilayer heterostructure and low temperature AlGaAs cladding layers (dashed line).

FIG. 6 shows the diffraction pulses for both the SI/LT and INT/LT samples for the same absorbed power of 43 $mW/cm^2$. The field was flipped every 100 µsec after the diffraction pulse had completely decayed away. The INT/LT device rises and decays approximately four times faster than the SI/LT yielding a proportionally higher sensitivity. With no traps in the MQW region of the INT/LT sample it is much more likely for a photogenerated carrier to make it all the way across the well and fully participate in screening.

Figure 7:
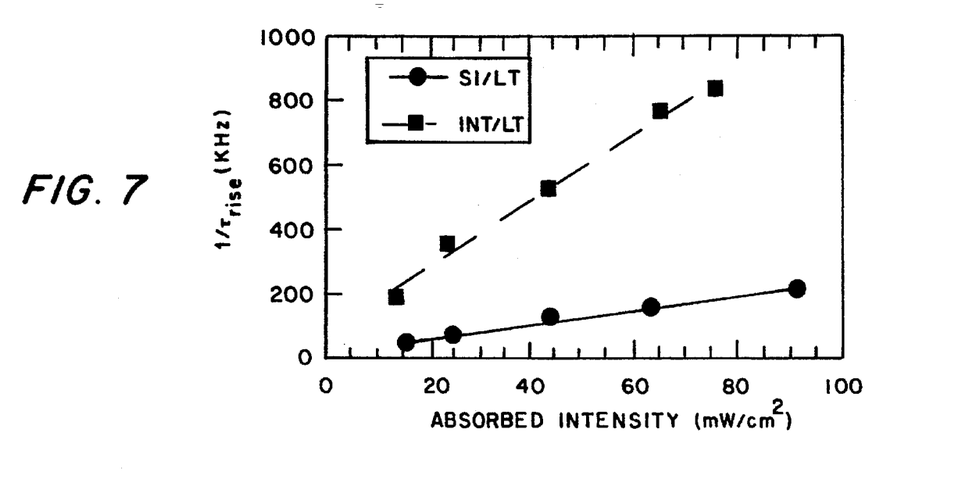
FIG. 7 is a graph showing the inverse of the rise time vs. absorbed intensity for a prior art device with a proton implanted multilayer heterostructure and low temperature AlGaAs cladding layers (◆), and a device according to the present invention having an intrinsic multilayer heterostructure and low temperature AlGaAs cladding layers (■).

FIG. 7 shows the inverse of the rise time of diffraction pulses in both the SI/LT and INT/LT samples as a function of absorbed pump intensity. The amount of absorbed energy, averaged over one grating period, needed for the SI/LT sample to reach peak diffraction is 0.35 $\mu J/cm^2$. The amount of energy for the INT/LT sample to reach peak diffraction is 0.08 $\mu J/cm^2$. This means that the SI/LT sample needs approximately 8 photons to produce one carriers worth of screening, while the INT/LT sample needs only about 2 photons. The maximum efficiency possible would be 0.5 photons per carrier since each absorbed photon produces an electron-hole pair.

Contrary to prior work on MQW OASLMs, the present invention shows that bulk traps are not necessary and are in fact detrimental to the performance of these devices. Samples with the MQW region left as grown and with highly resistive LT AlGaAs layers show comparable resolution performance, larger diffraction efficiencies and more than four times the sensitivity of materials with bulk traps and LT layers. This high sensitivity should allow these materials to work at lower light levels and at speeds higher than 1 MHz without the heating problems that would be present in less sensitive devices.

Obviously, many modifications and variations of the present invention are possible in light of the above teachings. It is therefore to be understood that, within the scope of the appended claims, the invention may be practiced otherwise than as specifically described.

What is claimed is:

1. An optically addressed spatial light modulator, comprising:

a photodiffracting intrinsic semiconductor multilayer structure, including a plurality of quantum wells;

a top conductive layer;

a bottom conductive layer, said top conductive layer and said bottom conductive layer sandwiching said intrinsic semiconductor multilayer structure, at least said top conductive layer being at least partially transparent;

a means for generating an electrical potential between said top conductive layer and said bottom conductive layer, thereby producing an electrical field within said intrinsic semiconductor multilayer structure;

at least one cladding layer sandwiched between said intrinsic semiconductor multilayer structure and said top conductive layer or said bottom conductive layer;

said at least one cladding layer, as used in said optically addressed spatial light modulator, having a trapping density sufficiently high, at said applied electrical potential, to trap essentially all photocarriers from said intrinsic semiconductor multilayer and avoid saturation.

2. The optically addressed spatial light modulator of claim 1, further comprising a dielectric layer sandwiched between said cladding layer and its nearest conductive layer.

3. The optically addressed spatial light modulator of claim 1 wherein said bottom conductive layer is sandwiched between a substrate and said intrinsic semiconductor multilayer structure.

4. The optically addressed spatial light modulator of claim 3, wherein said substrate is transparent.

5. An optically addressed spatial light modulator, comprising:

a photodiffracting intrinsic semiconductor multilayer structure, including a plurality of quantum wells, sandwiched between a top cladding layer and a bottom cladding layer;

a top conductive layer;

a bottom conductive layer, said top conductive layer and said intrinsic semiconductor multilayer structure sandwiching said top cladding layer therebetween, said bottom conductive layer and said intrinsic semiconductor multilayer sandwiching said bottom cladding layer therebetween, at least said top conductive layer being essentially transparent to light modulated by said light modulator;

a means for generating an electrical potential between said top conductive layer and bottom conductive layer, thereby producing an electrical field between said top cladding layer and said bottom cladding layer and within said intrinsic semiconductor multilayer structure;

said top cladding layer, as used in said optically addressed spatial light modulator, having a trapping density sufficiently high, at said applied electrical potential, to trap essentially all photocarriers from said intrinsic semiconductor multilayer and avoid saturation;

said bottom cladding layer, as used in said optically addressed spatial light modulator, having a trapping density sufficiently high, at said applied electrical potential, to trap photocarriers generated in said intrinsic semiconductor multilayer structure.

6. The optically addressed spatial light modulator of claim 5, wherein said intrinsic semiconductor multilayer structure comprises layers of quantum wells alternating with barrier layers.

7. The optically addressed spatial light modulator of claim 6, wherein said quantum well layers are intrinsic GaAs and said barrier layers are intrinsic AlGaAs.

8. The optically addressed spatial light modulator of claim 7, wherein said cladding layer is low temperature AlGaAs or low temperature GaAs.

9. The optically addressed spatial light modulator of claim 6, wherein said dielectric layer is sandwiched between said top cladding layer and said top electrode.

10. The optically addressed spatial light modulator of claim 5, further comprising a dielectric layer sandwiched between said top cladding layer or said bottom cladding layer and said top conductive layer or said bottom conductive layer, respectively.

11. The optically addressed spatial light modulator of claim 5, wherein said bottom conductive layer is sandwiched between a substrate and said bottom cladding layer.

12. The optically addressed spatial light modulator of claim 11, wherein said substrate is transparent.

13. The optically addressed spatial light modulator of claim 11, comprising a reflector layer sandwiched between said substrate and said bottom cladding layer.

14. The optically addressed spatial light modulator of claim 13, wherein said reflector layer is a Bragg reflector.

15. The optically addressed spatial light modulator of claim 13, wherein said reflector layer is sandwiched between said bottom conductive layer and said bottom cladding layer.

16. The optically addressed spatial light modulator of claim 13, wherein said bottom conductive layer is said reflector layer.

17. The optically addressed spatial light modulator of claim 5, wherein said cladding layer is low temperature AlGaAs or low temperature GaAs.

18. The optically addressed spatial light modulator of claim 5, wherein said bottom conductive layer is essentially transparent to light modulated by said light modulator.

19. A method of modulating light, comprising the steps of:

imposing an alternating current voltage between and perpendicular to a top conductive layer and a bottom conductive layer, said top and bottom conductive layers sandwiching a photodiffracting intrinsic semiconductor multilayer structure including a plurality of quantum wells and at least one cladding layer sandwiched between said intrinsic semiconductor multilayer structure and said top conductive layer or said bottom conductive layer, thereby forming an electrical field within said intrinsic semiconductor multilayer;

exposing said intrinsic semiconductor multilayer structure to a write beam of light so as to generate charged photocarriers in said intrinsic semiconductor multilayer structure, whereupon said charged photocarriers travel toward an oppositely charged one of said top and bottom conductive layers and whereupon essentially all of said charged photocarriers that contact said at least one cladding layer become laterally restricted by said at least one cladding layer thus modulate the electrical field within said intrinsic semiconductor multilayer;

detecting said modulation of said electrical field within said intrinsic semiconductor multilayer by exposing said intrinsic semiconductor multilayer to a read beam.

20. The method of claim 19 wherein intrinsic semiconductor multilayer structure is sandwiched between two cladding layers, each of said cladding layers being sandwiched between said intrinsic semiconductor multilayer and said corresponding top or bottom conductive layers, each of said two cladding layers laterally restricting essentially all of said charged photocarriers in contact therewith.

* * * * *